(12) United States Patent
Liu et al.

(10) Patent No.: US 9,203,056 B1
(45) Date of Patent: Dec. 1, 2015

(54) OLED STRUCTURE

(71) Applicant: EverDisplay Optronics (Shanghai) Limited, Shanghai (CN)

(72) Inventors: Chih-hung Liu, Shanghai (CN); Cheng-hsien Wang, Shanghai (CN); Lu-nan Sun, Shanghai (CN); Wei-ting Chen, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/470,578

(22) Filed: Aug. 27, 2014

(30) Foreign Application Priority Data

Jul. 4, 2014 (CN) .......................... 2014 1 0317451

(51) Int. Cl.
*H01L 51/52* (2006.01)
*H01L 51/50* (2006.01)
*H01L 51/54* (2006.01)
*H01L 51/00* (2006.01)

(52) U.S. Cl.
CPC ........ *H01L 51/5293* (2013.01); *H01L 51/5206* (2013.01); *H01L 51/5221* (2013.01); *H01L 51/5271* (2013.01); *H01L 51/004* (2013.01); *H01L 2251/301* (2013.01); *H01L 2251/308* (2013.01)

(58) Field of Classification Search
CPC ...... H01L 2251/50–2251/568; H01L 51/5234; H01L 51/5271; H01L 51/5203; H01L 51/5218; H01L 51/52; H01L 51/5262; H01L 51/5212; H01L 51/442; H01L 27/3258; H01L 31/022466; H01L 31/1884; H01L 2251/308; H01L 33/405
USPC .................................................. 313/498–512
See application file for complete search history.

(56) References Cited

U.S. PATENT DOCUMENTS

| | | | |
|---|---|---|---|
| 2005/0073230 A1* | 4/2005 | Nishikawa et al. | 313/111 |
| 2005/0088085 A1* | 4/2005 | Nishikawa et al. | 313/506 |
| 2005/0142976 A1* | 6/2005 | Suzuki | H01L 27/3211 445/24 |
| 2008/0080573 A1* | 4/2008 | Kawaguchi et al. | 372/26 |
| 2013/0161589 A1* | 6/2013 | Hirose et al. | 257/40 |
| 2014/0159020 A1* | 6/2014 | Song et al. | 257/40 |
| 2014/0239272 A1* | 8/2014 | Kim | 257/40 |
| 2014/0246688 A1* | 9/2014 | Dobner et al. | 257/88 |
| 2015/0008419 A1* | 1/2015 | Li | 257/40 |

\* cited by examiner

*Primary Examiner* — Anne Hines
*Assistant Examiner* — Jose M Diaz
(74) *Attorney, Agent, or Firm* — Yunling Ren; Eaton & Van Winkle

(57) ABSTRACT

The present disclosure provides an OLED structure. The OLED structure includes a cathode layer, an organic light emitting layer, and an anode layer. The organic light emitting layer is located between the cathode layer and the anode layer. A reflective layer is formed under the cathode layer and the anode layer, an insulation isolation layer is formed on the reflective layer. In the present disclosure, structural modification is performed on the anode of the OLED structure to directly avoid possibility of hill lock in the anode. Thus, improvement in the reliability, productivity and yield of the OLED is ensured.

7 Claims, 2 Drawing Sheets

OLED STRUCTURE

CROSS REFERENCE TO RELATED APPLICATIONS

The present application claims priority under 35 U.S.C. §119 to Chinese Patent Applications No. 201410317451.8, filed on Jul. 4, 2014, the entire contents of which are incorporated herein by reference.

TECHNICAL FIELD

The present disclosure generally relates to modification of an Organic Light Emitting Display (OLED) structure, and more particularly to an OLED structure capable of ensuring reliability of the OLED.

BACKGROUND

An OLED refers to a light emitting phenomenon of organic semiconductor material and luminescent material through carrier injection and recombination driven by an electric field. The principle is that when an ITO transparent electrode and a metal electrode are used respectively as an anode and a cathode of a device, under a certain driven voltage, electrons and holes are injected respectively from the cathode and the anode to an electron transport layer and a hole transport layer, migrate respectively to a light emitting layer through the electron transport layer and the hole transport layer, meet in the light emitting layer to form excitons and make light emitting molecules excited, the latter emitting visible light through radiation relaxation. Radiation light may be observed from one side of the ITO, with a metal electrode film functioning as a reflective layer.

A bottleneck of producing an OLED mainly lies in a yield issue related to electrical property and reliability. The electrical property issue mainly refers to mura in a display panel. This issue may be effectively intercepted by a quality inspection system in a factory after the OLED product is completed. The reliability issue mainly refers to that a hill lock of an anode electrode film may cause a short circuit between the cathode and the anode of the OLED or result in components burning to form dark spots (DPs) when the OLED is in use. This issue may often occur after the quality inspection. Usually, when badness occurs, the product has already flowed to end-users, resulting in damage to the company's reputation.

As shown in FIG. 1, a schematic diagram of an OLED structure in related technologies is illustrated. The OLED structure includes a cathode 9, an organic light emitting layer 8 and an anode 7. The anode 7 is an anode metal reflective plane, and the cathode 9 is formed of metal having high light transmittance, such as silver, magnesium or indium tin oxide (ITO), etc. In related technologies, the anode 7 may be of a double-layer or triple-layer structure, for example, three layers of ITO/Ag/ITO, or two layers of ITO/Ag. ITO may be replaced with any transparent conductive metal as long as it may realize an anode function of the OLED. Ag forms a light reflection layer and may be replaced with any metal that has high reflectance, such as Al. However, in such an OLED structure, since a high electric field or high current is applied and a distance between the anode 7 and the cathode 9 is about 0.3 um, there exists very large relative electric field intensity. Ag/Al may be affected by the electric field so that atoms will move along a grain boundary in the direction of the current to cause a spiking phenomenon, i.e., an electro-migration phenomenon. Metal in the anode 7 will be caused to form a hill lock toward the direction of the cathode 9, which will cause a short circuit between the anode 7 and the cathode 9 of the OLED when the OLED is in use, or result in components burning to form DPs.

In addition, for example, Chinese invention patent Publication No. CN1691860A discloses a top-emitting organic electroluminescent display. As shown in FIG. 2, the top-emission organic electroluminescent display includes: a reflective layer 210a, a metal-silicide layer 210b and a transparent electrode layer 210c disposed on a substrate 200, an organic layer 230 including at least one layer of emission layer, and a second electrode layer 240. The metal-silicide layer 210b is disposed between the reflective layer 210a and the transparent electrode layer 210c to suppress electrical corrosion generated at an interface between the reflective layer 210a and the transparent electrode layer 210c and to stabilize a contact electrical resistance between the layers so that pixels with a uniform brightness may be obtained and images of high quality may be achieved.

However, in this patent, the metal-silicide layer 210b may only suppress the electrical phenomenon and forming of a metal oxide layer at an interface between the reflective layer and the transparent electrode layer. The issue that the metal material of the reflective layer 210a is affected by the electric field and the current to form a hill lock is not fundamentally solved.

SUMMARY

According to an aspect of embodiments of the present disclosure, an OLED structure is provided.

An embodiment of the present disclosure provides an OLED structure. The OLED structure includes: a cathode layer; an anode layer; an organic light emitting layer located between the cathode layer and the anode layer; a reflective layer formed under the cathode layer and the anode layer; and an insulation isolation layer formed on the reflective layer.

According to an embodiment of the present disclosure, the reflective layer is formed to have a floating potential.

According to an embodiment, the insulation isolation layer is a single silicon oxide or a single silicon nitride film.

According to an embodiment, the insulation isolation layer is a multilayered silicon oxide or silicon nitride film.

According to an embodiment, the reflective layer is an aluminum, silver or nickel metal film.

According to an embodiment, the reflective layer has two surfaces, i.e., an upper surface and a lower surface, and the two surfaces are decorated with indium tin oxide or indium zinc oxide.

According to an embodiment, the reflective layer is formed simultaneously with a gate electrode layer or a drain electrode layer.

According to an embodiment, the insulation isolation layer is a multilayered organic optical material layer.

According to an embodiment, the organic optical material layer is formed by performing a dye process or a stretching process on a single layer of polyvinyl alcohol-based resin that has been made into a film shape.

According to an embodiment, the organic optical material layer is formed by coating a polyvinyl alcohol-based resin layer on a thermoplastic resin matrix material and stretching the polyvinyl alcohol-based resin layer formed on the resin matrix material together with the resin matrix material.

In the present disclosure, structural modification is performed on the anode of the OLED structure to directly avoid possibility of hill lock in the anode. Thus, improvement in the reliability, productivity and yield of the OLED is ensured.

Figure 1:
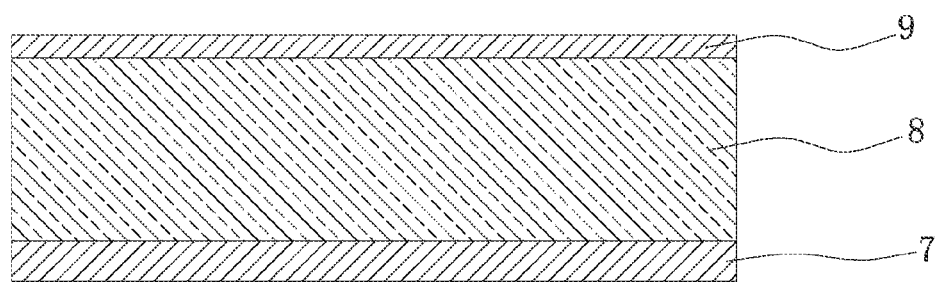
FIG. 1 is a schematic diagram of an existing OLED structure.
Figure 2:
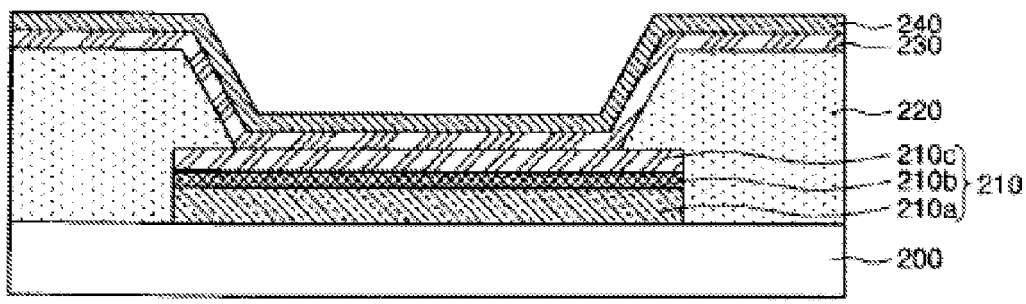
FIG. 2 is a schematic diagram of another existing OLED structure.

Description of reference numbers are as follows:
1 cathode layer;
2 organic light emitting layer;
3 anode layer;
4 isolation layer;
5 reflective layer;
9 cathode;
8 organic light emitting layer;
7 anode;
210a reflective layer;
210b metal-silicide layer;
210c transparent electrode layer;
210 first electrode layer 210;
230 organic layer;
240 second electrode layer.

DETAILED DESCRIPTION

Typical embodiments representing features and advantages of the present disclosure will be explained in the following description. It shall be understood that the present disclosure may have various alterations in different embodiments without departing the scope of the present disclosure, and the description and accompany drawings is in nature for the explanation purpose but not for limitation of the present disclosure.

An OLED structure provided by embodiments of the present disclosure (referring to FIG. 3 and FIG. 4) includes a cathode layer 1, an organic light emitting layer 2, an anode layer 3, an isolation layer 4 and a reflective layer 5. The organic light emitting layer 2 is located between the cathode layer 1 and the anode layer 3. The reflective layer 5 is formed under the cathode layer 1 and the anode layer 2 (the two layers are interchangeable). The insulation isolation layer 4 is formed on the reflective layer 5. Thus, functions of the electrodes and the reflective layer are separated, and the reflective layer performs a reflection function only but does not have an electrode function. Thereby, the issue will be fundamentally solved that under a high electric field or high current, metal in the anode will be caused to form a hill lock toward the direction of the cathode, which will cause a spiking phenomenon between the cathode and the anode of the OLED; and thus DPs resulted by components burning may be avoided.

Figure 3:
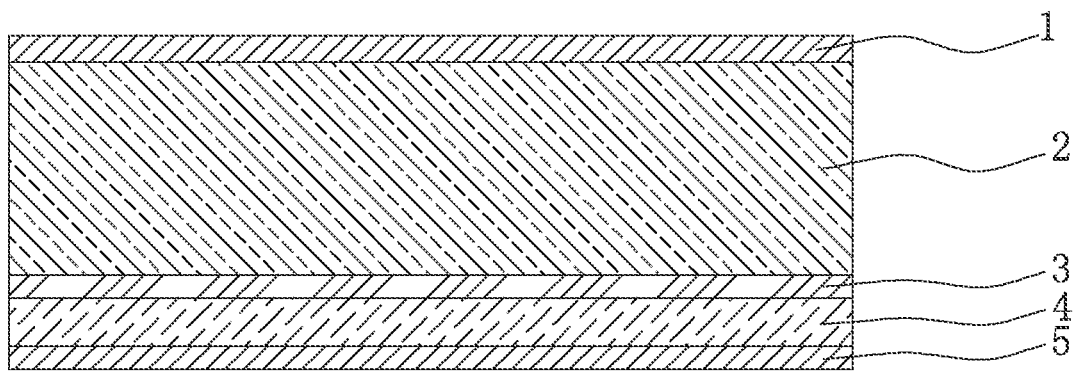
FIG. 3 is a schematic diagram of an OLED structure according to an embodiment of the present disclosure.
Figure 4:
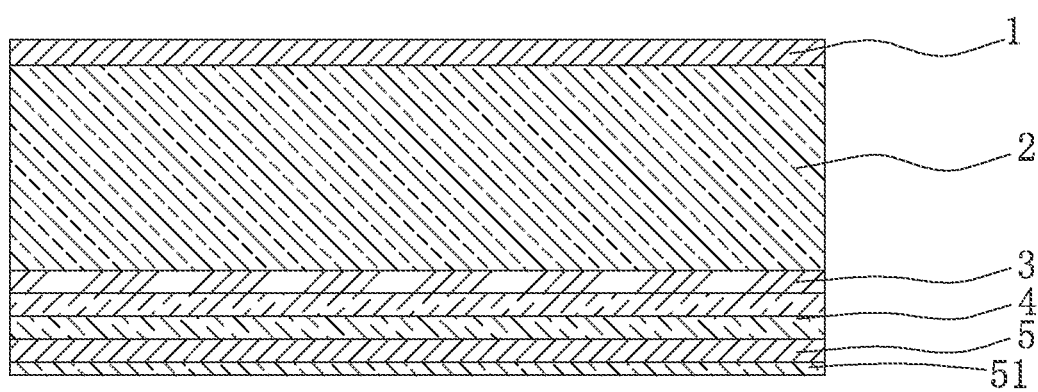
FIG. 4 is a schematic diagram of another OLED structure according to an embodiment of the present disclosure.

As shown in FIG. 3, it is a specific embodiment of the present disclosure. An OLED structure may include a cathode layer 1, an organic light emitting layer 2, an anode layer 3, an isolation layer 4 and a reflective layer 5 subsequently from the top to the bottom.

The cathode layer 1 is a transparent or translucent conductor that may be formed of metal having high light transmittance such as silver, magnesium or indium tin oxide (ITO), etc. The small-sized cathode and anode need to be separated during fabrication. The process used is a mushroom structure approach, which is similar to a negative photoresist development technique.

The organic light emitting layer 2 is located between the cathode layer 1 and the anode layer 3. The organic light emitting layer 2 typically has two input layers and one light emitting layer. The input layers are divided into an electron transport layer and a hole transport layer. The light emitting layer does not necessarily exist separately, and it is possible that the electron transport layer or the hole transport layer functions as a transport layer and a light emitting layer. The transport layers exhibit characteristics of unidirectional polarization so that recombination of the holes and the electrons is conducted in the light emitting layer. The electron transport layer (ETM) may be a fluorescent dye compound that should be thermally stable and surface stable, and organometallic complexes have sufficient thermal stability. In order to ensure efficient electron injection, an energy level (lowest empty orbital of a molecule) at the LUMO (Lowest Unoccupied Molecular Orbital, the Orbital with the lowest energy level that is not occupied by electrons is called as Lowest Unoccupied Molecular Orbital) of the electron transport layer should be matched with a work function of the cathode.

Hole transport material (HTM) of the hole transport layer belongs to a family of aromatic amine compounds. It is TPD (Tg=60° C.), and the most stable device employs NPB (Tg=100° C.). In addition, the light emitting layer is prepared by a fluorescent dopant doped the phosphor matrix material. The matrix material is typically formed of the same material with the electron transport layer and the hole transport layer, and the fluorescent dopant is a thermally and photochemically stable laser dye. The fluorescent dyes should have high quantum efficiency and sufficient thermal stability, and may be sublimated without decomposition.

The anode layer 3 employs a metal oxide layer such as transparent or translucent indium tin oxide or indium zinc oxide (ITO/IZO), etc, and is fabricated by RF sputtering. Due to an overlarge resistance of the anode layer 3 which tends to cause an unnecessary external power consumption, it is preferred to add an auxiliary electrode to decrease voltage gradient, and this is a shortcut for lowering driving voltage. Chromium (Cr) is selected as the material for the auxiliary electrode. Cr has advantages such as an excellent stability to environmental factors and a large range of options for etching liquid. However, its resistance value remains large when the film is 100 nm and thus aluminum (Al) metal that has a lower resistance value at the same thickness (0.2 ohms/square meter) is another preferred option for the auxiliary electrode. However, the high activity of aluminum metal may make aluminum metal have issue of reliability. Therefore, a more preferred option is to use multilayered auxiliary metals, such as a Cr/Al/Cr multilayered structure or a Mo/Al/Mo multilayered structure.

The insulation isolation layer 4 is formed between the reflective layer 5 and the anode layer 3. In one case, the insulation isolation layer may be a single or a multilayered silicon oxide or silicon nitride film (a multilayered silicon oxide film in FIG. 4) so that the metal reflective layer 5 may be insulated from the anode layer 3. In one specific embodiment, a material of the insulation layer may be $SiO_x$, $SiN_x$ or $SiON_x$, and these materials form a single or a multilayered structure with a total thickness of 30 to 300 angstroms (A). The functions of the electrode and the reflective layer are separated so that the reflective layer performs a reflection function only but does not have an electrode function.

A driving part 51 of the OLED may be under the reflective layer 5. In related technologies, the driving part 51 typically employs a TFT driving structure. In this figure, only a part of but not all of the driving part 51 is shown.

Another option is that the isolation layer 4 is formed of a single or a multilayered an organic optical material layer that has a polarization effect, so as to enhance the reflectivity of the reflective layer 5. The organic optical material layer may be a polyvinyl alcohol-based resin formed by performing a dye process or a stretching process on a single layer of polyvinyl alcohol-based resin that has been made into a film shape. However, by this preparation method, a thickness of the polyvinyl alcohol-based resin layer is greater than 10 nm, which may not well satisfy the requirement of the embodiments of the present disclosure. Therefore, a better option is that a polyvinyl alcohol-based resin layer is coated on a thermoplastic resin matrix material, and the polyvinyl alcohol-based resin layer formed on the resin matrix material together with the resin matrix material are stretched. Thus, the single organic optical material layer may have a thickness between 5-10 nm.

The reflective layer 5 is separately formed under the electrode layer. The reflective layer has a floating potential, and is not given any electrical signal, so the reflective layer 5 performs only a reflection function. The reflective layer 5 is mainly made of aluminum, silver, nickel (AL/Ag/Ni) with related metal alloy to form a flat and smooth horizontal plane. Moreover, the reflective layer 5 may also be formed simultaneously with or separately from a gate electrode layer or a drain electrode layer. Preferably, the reflective layer 5 is a sandwich structure in which the middle layer is a metal layer, and the top layer and the lower layer may be an oxide metal layer formed of indium tin oxide or indium zinc oxide (ITO/IZO), etc., to protect and decorate the metal layer and thereby avoid influence on reflection effects resulted from chemically reacting with other material.

The reflective layer and the anode (ITO) are separated, and the reflective layer is independent and is not given any electrical signal. Thus, the metal serving as the reflective layer is affected by the OLED electric field is avoided, and thereby the occurrence of electromigration is avoided.

Another option is that the reflective layer 5 is grounded, and thus when unevenness in electric field in the anode layer 3 occurs and sudden increase in charge or change of electric field appears in some fields or some points, the reflective layer 5 may eliminate such unevenness in the electric field. Thereby, it is avoided that the cathode and the anode of the OLED are shorted to make components burn to form DPs in the case of sudden increase in electric field intensity or a high current during the usage of the OLED.

In the above embodiment, the reflective layer 5 may be a integrated layer, and may also be composed of a plurality of independent sections. These independent sections align with an organic light emitting region, and may be slightly greater than the organic light emitting region, desirably maximizing the reflection of the lights from the light emitting region. Thereby, the amount of material used may be saved to reduce the cost and meanwhile to improve the stability of the reflection effect in each region, and to avoid interactions between each other.

In embodiments of the present disclosure, structural modification is performed on the anode of the OLED structure to directly avoid possibility of hill lock in the anode. Thus, improvement in the reliability, productivity and yield of the OLED is ensured.

It may be appreciated from common technical knowledge that, the present disclosure may be embodied by other embodiments without departing from the essential spirit or essential features thereof. Therefore, for all purposes, the above embodiments of the present disclosure are all illustrative but not exclusive. All the changes within the scope of the present disclosure or within the scope equivalent to the present disclosure are all covered by the present disclosure.

What is claimed is:

1. An OLED structure, comprising:
   a cathode layer;
   an anode layer;
   an organic light emitting layer located between the cathode layer and the anode layer;
   a reflective layer formed under the cathode layer and the anode layer, wherein the reflective layer is a sandwich structure in which the middle layer is a metal layer, and each of a top layer and a lower layer of the sandwich structure is an oxide metal layer formed of indium tin oxide or indium zinc oxide; and
   an insulation isolation layer formed on the reflective layer and inserted between the reflective layer and the anode layer.

2. The OLED structure according to claim 1, wherein the reflective layer is formed to have a floating potential.

3. The OLED structure according to claim 1, wherein the insulation isolation layer is a single silicon oxide film or a single silicon nitride film.

4. The OLED structure according to claim 1, wherein the insulation isolation layer is a multilayered silicon oxide film or a multilayered silicon nitride film.

5. The OLED structure according to claim 1, wherein the insulation isolation layer is a multilayered organic optical material layer.

6. The OLED structure according to claim 5, wherein the organic optical material layer is formed by performing a dye process or a stretching process on a single layer of polyvinyl alcohol-based resin that has been made into a film shape.

7. The OLED structure according to claim 5, wherein the organic optical material layer is formed by coating a polyvinyl alcohol-based resin layer on a thermoplastic resin matrix material and stretching the polyvinyl alcohol-based resin layer formed on the resin matrix material together with the resin matrix material.

\* \* \* \* \*